(12) United States Patent
Gaudiana et al.

(10) Patent No.: US 6,706,963 B2
(45) Date of Patent: Mar. 16, 2004

(54) PHOTOVOLTAIC CELL INTERCONNECTION

(75) Inventors: Russell Gaudiana, Merrimack, NH (US); Lian Li, N. Chelmsford, MA (US)

(73) Assignee: Konarka Technologies, Inc., Lowell, MA (US)

( * ) Notice: Subject to any disclaimer, the term of this patent is extended or adjusted under 35 U.S.C. 154(b) by 0 days.

(21) Appl. No.: 10/057,394

(22) Filed: Jan. 25, 2002

(65) Prior Publication Data

US 2003/0140959 A1 Jul. 31, 2003

(51) Int. Cl.[7] .................. H01L 31/05; H01L 31/048; H01L 27/142; H01M 12/00
(52) U.S. Cl. .................. 136/263; 136/251; 136/244; 136/256; 429/111; 257/40; 257/43; 257/431
(58) Field of Search .................. 136/263, 251, 136/244, 256; 429/111; 257/40, 43, 431

(56) References Cited

U.S. PATENT DOCUMENTS

| | | |
|---|---|---|
| 3,037,122 A | 5/1962 | Strother |
| 3,069,487 A | 12/1962 | Strother |
| 3,206,831 A | 9/1965 | Strother |
| 3,206,832 A | 9/1965 | Strother |
| 3,679,949 A | 7/1972 | Uekusa et al. |
| 3,969,163 A | 7/1976 | Wakefield |
| 3,984,256 A | 10/1976 | Fletcher et al. |
| 4,080,488 A | 3/1978 | Chen et al. |
| 4,385,102 A | 5/1983 | Fitzky et al. |
| 4,436,558 A | 3/1984 | Russak |
| 4,492,743 A | 1/1985 | Howe |
| 4,684,537 A | 8/1987 | Graetzel et al. |
| 4,872,925 A | 10/1989 | McMaster |
| 4,913,744 A | 4/1990 | Hoegl et al. |
| 4,927,721 A | 5/1990 | Gratzel et al. |
| 5,084,365 A | 1/1992 | Gratzel et al. |
| 5,178,685 A | 1/1993 | Borenstein et al. |
| 5,331,183 A | 7/1994 | Sariciftci et al. |
| 5,350,644 A | 9/1994 | Graetzel et al. |
| 5,385,614 A | 1/1995 | Albright et al. |
| 5,437,736 A | 8/1995 | Cole |
| 5,441,827 A | 8/1995 | Gratzel et al. |
| 5,454,879 A | 10/1995 | Bolger |
| 5,454,880 A | 10/1995 | Sariciftci et al. |
| 5,463,057 A | 10/1995 | Graetzel et al. |
| 5,482,570 A | 1/1996 | Saurer et al. |
| 5,525,440 A | 6/1996 | Kay et al. |
| 5,569,561 A | 10/1996 | Exnar et al. |

(List continued on next page.)

FOREIGN PATENT DOCUMENTS

| | | |
|---|---|---|
| DE | 42 21 084 A1 | 1/1994 |
| DE | 93 08 513 | 1/1994 |
| EP | 0 739 020 A2 | 10/1996 |

(List continued on next page.)

OTHER PUBLICATIONS

O'Regan et al., "A Low–Cost, High–Efficiency Solar Cell Based on Dye–Sensitized Colloidal $TiO_2$ Films," *Nature*, vol. 353, pps. 737–739, (1991).

(List continued on next page.)

*Primary Examiner*—Alan Diamond
(74) *Attorney, Agent, or Firm*—Testa, Hurwitz & Thibeault, LLP (57) ABSTRACT

In one aspect, the invention provides photovoltaic modules. In one embodiment, a photovoltaic module includes a plurality of photovoltaic cells, at least two of which include a photosensitized nanomatrix layer and a charge carrier media. Preferably, the cells further include a catalytic media layer. The photovoltaic cells are disposed between a first electrical connection layer and a second electrical connection layer. In one embodiment, the cells are interconnected in series and the electrical connections layers each include conductive and insulative regions.

33 Claims, 8 Drawing Sheets

U.S. PATENT DOCUMENTS

| | | | |
|---|---|---|---|
| 5,637,156 A | * | 6/1997 | Kubota et al. ............ 136/251 |
| 5,641,362 A | | 6/1997 | Meier |
| 5,728,487 A | | 3/1998 | Gratzel et al. |
| 5,789,592 A | | 8/1998 | Gratzel et al. |
| 5,830,597 A | * | 11/1998 | Hoffman et al. ............ 429/111 |
| 5,881,083 A | | 3/1999 | Diaz-Garcia et al. |
| 5,885,368 A | | 3/1999 | Lupo et al. |
| 5,902,416 A | | 5/1999 | Kern et al. |
| 5,906,004 A | | 5/1999 | Lebby et al. |
| 5,986,206 A | * | 11/1999 | Kambe et al. ............ 136/263 |
| 6,013,871 A | | 1/2000 | Curtin |
| 6,024,807 A | | 2/2000 | Pappas et al. |
| 6,043,428 A | | 3/2000 | Han et al. |
| 6,067,184 A | | 5/2000 | Bonhôte et al. |
| 6,067,313 A | | 5/2000 | Cafarella et al. |
| 6,069,313 A | * | 5/2000 | Kay ............ 136/249 |
| 6,075,203 A | | 6/2000 | Wang et al. |
| 6,080,690 A | | 6/2000 | Lebby et al. |
| 6,084,176 A | | 7/2000 | Shiratsuchi et al. |
| 6,121,540 A | | 9/2000 | Takeda et al. |
| 6,130,378 A | | 10/2000 | Hatano et al. |
| 6,175,075 B1 | | 1/2001 | Shiotsuka et al. |
| 6,232,547 B1 | | 5/2001 | Meissner et al. |
| 6,239,355 B1 | | 5/2001 | Salafsky |
| 6,245,988 B1 | | 6/2001 | Gratzel et al. |
| 6,278,056 B1 | | 8/2001 | Sugihara et al. |
| 6,281,429 B1 | | 8/2001 | Takada et al. |
| 6,288,324 B1 | | 9/2001 | Komori et al. |
| 6,288,325 B1 | | 9/2001 | Jansen et al. |
| 6,288,326 B1 | | 9/2001 | Hayashi et al. |
| 6,291,763 B1 | * | 9/2001 | Nakamura ............ 136/256 |
| 6,310,282 B1 | | 10/2001 | Sakurai et al. |
| 6,335,480 B1 | | 1/2002 | Bach et al. |
| 6,350,946 B1 | * | 2/2002 | Miyake et al. ............ 136/252 |
| 6,376,765 B1 | * | 4/2002 | Wariishi et al. ............ 136/263 |
| 6,384,321 B1 | | 5/2002 | Mikoshiba et al. |
| 6,426,827 B1 | | 7/2002 | Bonhôte et al. |
| 2001/0004901 A1 | * | 6/2001 | Yamanaka et al. ............ 136/263 |
| 2001/0032665 A1 | | 10/2001 | Han et al. |
| 2003/0056821 A1 | * | 3/2003 | Chittibabu et al. ............ 136/250 |
| 2003/0127130 A1 | | 7/2003 | Murai et al. ............ 136/263 |

FOREIGN PATENT DOCUMENTS

| | | |
|---|---|---|
| EP | 0901175 A2 | 10/1999 |
| EP | 1 089 305 A2 | 4/2001 |
| JP | 59-125670 | 7/1984 |
| JP | 59-144177 | 8/1984 |
| JP | 2000-294306 A * | 10/2000 |
| WO | WO91/16719 | 10/1991 |
| WO | WO-91/16719 A2 * | 10/1991 |
| WO | 96/29715 | 9/1996 |

OTHER PUBLICATIONS

Bard, "Spectral Sensitization of the Heterogeneous Photocatalytic Oxidation of Hydroquinone in Aqueous Solutions at Phthalocyanine—Coated $TiO_2$ Powders," *American Chemical Society*, vol. 101, pps. 6139–6140, (1979).

Borgarello, et al., "Sustained Water Cleavage by Visible Light," *Journal American Society*, vol. 103, pps. 6324–6329, (1981).

Gratzel et al., Integrated Systems for Water Clevage by Visible Light: Sensitization of $TiO_2$ Particles by Surface Derivation with Ruthenium Complexes,: *Helvetica Chimica Acta*, vol. 67, pps. 1012–118, (1984).

Gratzel et al., "Photosensitized Electron Injection in Colloidal Semiconductors," *Journal American Chemistry Society*, vol. 106, pps. 6557–6564, (1984).

Gratzel et al., "Sensitization of $TiO_2$ in the Visible Light Region Using Zinc Porphyrins," *American Chemical Society*, vol. 91, pps. 2342–2347, (1987).

Argazzi et al., "Light–Induced Charge Separation Across Ru(II)–Modified Nanocrystalline $TiO^2$ Interfaces with Phenothiazine Donors," *J. Phys. Chem. B.*, vol. 101, No. 14, pp. 2591–2597, (1997).

Bonhôte et al., "Efficient Lateral Electron Transport Inside a Monolayer of Aromatic Amines Anchored on Nanocrystalline Metal Oxide Films," *J. Phys. Chem. B.*, vol. 102, No. 9, pp. 1498–1507, (1998).

Bonhôte et al., "Long–Lived Photoinduced Charge Separation and Redox–Type Photochromism on Mesoporous Oxide Films Sensitized by Molecular Dyads," *J. Am. Chem. Soc.* vol. 121, No. 6, pp. 1324–1336, (1999).

Patent Cooperation Treaty (PCT) International Search Report International application No. PCT/US03/02094; mailed Sep. 23, 2003.

"Rod–like Dinuclear Ruthenium Complexes for Dye–sensitized Photovoltaics" by Mosurkal et al., Mat. Res. Soc. Symp. Proc. vol. 708, pp. 367–373 (2002).

\* cited by examiner

PHOTOVOLTAIC CELL INTERCONNECTION

FIELD OF THE INVENTION

The invention relates generally to the field of photovoltaic materials. In particular, the invention relates to a method and apparatus for interconnected photovoltaic cells.

BACKGROUND OF THE INVENTION

The desire to reduce personal and commercial dependencies on fossil fuel energy sources has been largely responsible for the development of many photovoltaic materials and devices. These developments have also been predicated upon the goal of discovering new environmentally friendly energy sources. Progress and innovation in this field are principally restricted by the costs associated with fabricating photovoltaic devices. The energy and material costs of producing such devices must be recoverable in the electrical energy produced by the device over some reasonable recovery timeframe for the device and its methods of manufacture to be commercially feasible. In addition, the technological feasibility of efficiently manufacturing the devices is a major limiting factor in the field.

When manufacturing photovoltaic modules having a plurality of individually electrically connected photovoltaic cells, the characteristics of the electrical connections between the cells can be a source of economic and technological concerns. Where the surface area of a photovoltaic module is consumed by those regions dedicated to electrically connecting individual photovoltaic cells, the maximum amount of energy per module that can ultimately be produced decreases. In the instance of thin film fabrication techniques, cell interconnections are typically created by a series of connector material deposition and removal steps. Currently utilized techniques, which require cutting into preformed photovoltaic cell regions via laser or mechanical scribes, increase the risk of manufacturing failures and concomitantly drive up costs. Further, using cut outs or selectively depositing and removing material, typically causes substantial material waste. As a result, the energy capturing regions in the photovoltaic device are reduced and the upper boundaries of photovoltaic module performance are limited.

SUMMARY OF THE INVENTION

Accordingly, in one embodiment, the invention provides photovoltaic modules with improved cell interconnections, along with methods for reducing manufacturing time and material waste. According to one embodiment, the invention provides a photovoltaic module having a plurality of photovoltaic cells reducing and/or obviating the need for electrical interconnections formed by repeated material removal. In one aspect, the invention provides a photovoltaic module having a plurality of photovoltaic cells disposed between two electrical connection layers. The photovoltaic cells include a photosensitized nanomatrix layer and a charge carrier media. Preferably, the photovoltaic cells also include a catalytic media layer disposed adjacent an electrical connection layer to facilitate charge transfer or current flow from the electrical connection layer to the charge carrier media In one embodiment, the electrical connection layers interconnect the photovoltaic cells in series. According to one feature, the first electrical connection layer serves as an anode for one group of photovoltaic cells, while also serving as a cathode for another group of photovoltaic cells. In another embodiment, the electrical connection layer interconnects the photovoltaic cells in parallel. In still another embodiment, a portion of the photovoltaic cells are interconnected in series and a portion are interconnected in parallel.

In one embodiment the electrical connection layers include both conductive regions and insulative regions. Preferably, the conductive regions are significantly light transmitting. In various embodiments, the electrical connection layers further include linking-conductor regions. In various versions of these embodiments, the electrical connection layers include groups of significantly light transmitting conductive regions that are electrically connected by light-blocking linking-conductor regions.

According to one feature, the photovoltaic cells of the invention include a photosensitized nanomatrix layer and a charge carrier media. As used herein, the term photosensitized nanomatrix layer includes a photosensitized layer having nanoparticles, a heterojunction composite material, and combinations thereof or the like. In one embodiment, the photosensitized nanomatrix layer includes photosensitized nanoparticles. Preferably, the photosensitized nanomatrix layer includes interconnected titanium dioxide nanoparticles. In another embodiment, the photosensitized nanomatrix layer includes a heterojunction composite material such as, for example, a composite of fullerene in polythiophene.

In another aspect, the invention provides methods of fabricating a photovoltaic module, having a plurality of interconnected photovoltaic cells. Photovoltaic cells amenable to fabrication by the methods of the invention include, but are not limited to, solid state devices, thin film layer devices, Gratzel cells, and dye sensitized nanoparticle devices. In various embodiments, the invention provides methods for fabricating photovoltaic cells on flexible, significantly light transmitting substrates. According to one feature, the methods of the invention also provide for fabrication by a continuous process, such as a roll-to-roll process. As a result, the methods of the invention enable fabrication of photovoltaic cells on a variety of substrate materials, which preferably are flexible at room temperature. Flexible substrates are typically amenable to continuous or semi-continuous manufacturing processes with relatively high throughput rates. As a result according to one embodiment of the invention, manufacturing is performed with relatively inexpensive processing techniques and materials, and finished products are relatively cost-effective and cost-competitive.

In one embodiment, a method for fabricating a plurality of interconnected photovoltaic cells includes: forming a group of photovoltaic cell portions on a first substrate; forming a group of photovoltaic cell portions on a second substrate; and combining the respective substrates and photovoltaic cell portions to form a plurality of interconnected photovoltaic cells.

In another embodiment, the invention provides a method for fabricating a plurality of interconnected photovoltaic cells. In this embodiment, the method includes: forming a group of photovoltaic cell portions on a first portion of a substrate; forming a group of photovoltaic cell portions on a second portion of the substrate; dividing the substrate to separate the first portion from the second portion; and combining the first and second substrate portions to form a plurality of interconnected photovoltaic cells.

BRIEF DESCRIPTION OF THE DRAWINGS

The invention is pointed out with particularity in the appended claims. However, the advantages of the invention described above, together with further advantages, may be better understood by referring to the following description taken in conjunction with the accompanying drawings. The drawings are not necessarily drawn to scale, and like reference designations refer to the same parts throughout the different views.

ILLUSTRATIVE DESCRIPTION

Referring to FIGS. 1A–B, 2, 3 and 5A–I, in various embodiments, a photovoltaic module 10, 22, 33, 55 according to the an illustrative embodiment of the invention includes a plurality of photovoltaic cells 110 disposed between a first electrical connection layer 105, and a second electrical connection layer 107. Preferably, the photovoltaic cells and electrical connection layers are in turn disposed between a first substrate 100 and a second substrate 102. The illustrative photovoltaic cells 110 include a photosensitized nanomatrix layer 165 and a charge carrier media 185. Preferably, the photovoltaic cells 110 further include a catalytic media 170. The illustrative electrical connection layers 105, 107 include conductive regions 152 and/or insulative regions 180. In one illustrative embodiment, the electrical connection layers 105, 107 also include linking conductive regions 160.

Figure 1A:
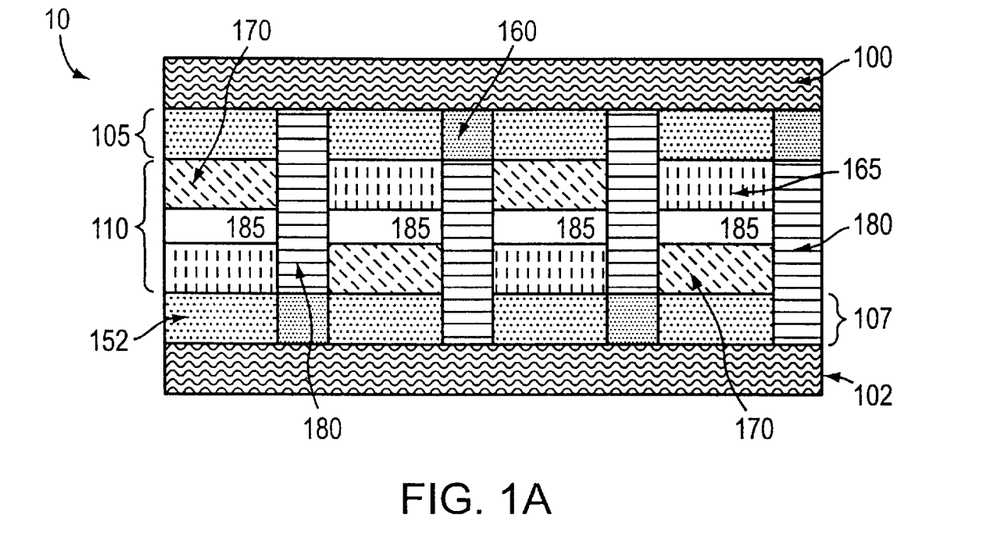
FIG. 1A is a cross-sectional view of a photovoltaic module having photovoltaic cells connected in series according to an illustrative embodiment of the invention.
Figure 1B:
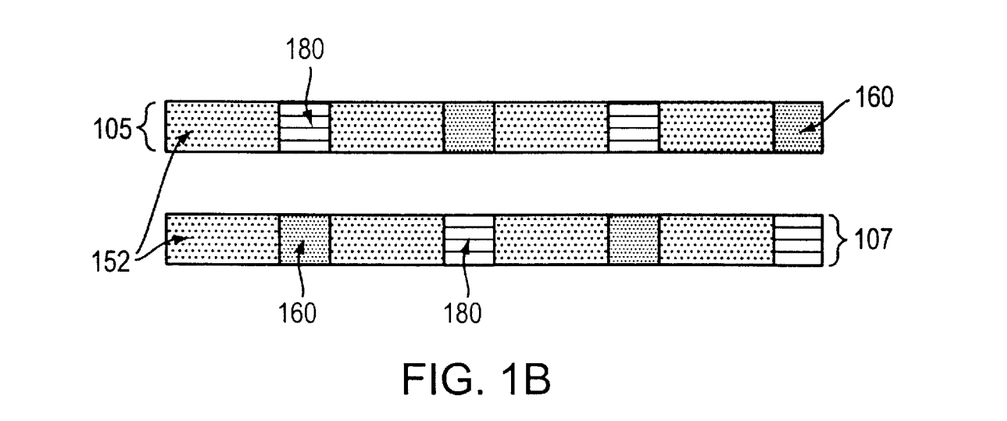
FIG. 1B is a cross-sectional view of an illustrative pair of electrical connection layers of the series connected photovoltaic cells of FIG. 1A.

Preferably, the electrical connection layers are substantially free of cut-out regions. FIG. 1B illustrates one embodiment of a first electrical connection layer 105 and a second electrical connection layer 107 prior to the formation of the photovoltaic cells 110 on the electrical connection layers or additional layers of insulative material on the insulative regions 180.

The electrical connection layers 105, 107 include conductive regions 152 and insulative regions 180, and may also include the linking conductor regions 160. It should be recognized that the widths of the various regions illustrated in FIGS. 1A, 1B, 2, 3 and 5 are not necessarily to absolute or relative scale. For example, as illustrated in FIG. 1B, the insulative regions 180 are depicted as being about half as wide as the conductive regions 152. However, it is preferable in practice to minimize the width of the insulative regions 180 and/or linking conductor regions 160 relative to the conductive regions 152.

According to the illustrative embodiment, the conductive 152 and insulative 180 regions of the electrical connection layers 105, 107 include transparent materials, such as, for example indium tin oxide (ITO), a fluorine-doped tin oxide, tin oxide, zinc oxide, and the like. In one illustrative embodiment, the conductive regions 152 of the electrical connection layers 105, 107 range between about 100 nm and about 500 nm thick. In another illustrative embodiment, the conductive regions 152 are between about 150 nm and about 300 nm thick. According to a further feature of the illustrative embodiment, a wire or lead line may be connected to one or more conductive regions 152 to electrically connect the photovoltaic module 10 to an external load.

Preferably, the photovoltaic module 10 is significantly light transmitting. This is accomplished in some embodiments by forming all of the constituent layers and regions of the photovoltaic module 10 to be significantly light transmitting. In other embodiments, the photovoltaic module 10 is formed to be significantly light transmitting even though some of the individual regions of the photovoltaic module constituent layers that are not significantly light transmitting. As used herein, the term significantly light transmitting region refers to regions adapted for transmitting at least about 60% of the visible light incident on the region. According to one preferred embodiment, the conductive regions 152 of at least one of the electrical connection layers 105 and 107 are significantly light transmitting.

As used herein, the term significantly light transmitting electrical connection layer refers to an electrical connection layer having one or more significantly light transmitting regions. Preferably, the electrical connection layers 105 and 107 are significantly light transmitting. However, a significantly light transmitting electrical connection layer may also include one or more regions that transmit substantially less than 60% of incident visible light. For example, a significantly light transmitting electrical connection layer, such as layers 105 and 107, may include transparent conductive regions, such as regions 152, of ITO, opaque linking conductor regions, such as regions 160, of copper, and insulative regions, such as regions 180, that transmit less than 60% of incident visible light.

The linking conductor regions 160 of the electrical connection layers 105, 107 may include any suitable conductive material. Suitable conductive materials include, but are not limited to, copper, silver, gold, platinum, nickel, palladium, iron, and alloys thereof. Other suitable conductive materials include, but are not limited to, ITO, and conductive polymers such as polyanilin, and anilin. In one embodiment, one or more of the linking conductor regions 160 are substantially transparent. In another embodiment, one or more of the linking conductive regions 160 are opaque.

Referring again to FIGS. 1A–2B, 2, 3, and 5A–5I, the illustrative photovoltaic cells 110 include a photosensitized nanomatrix layer 165 and a charge carrier media 185. The nanomatrix layer 165 may include, for example, photosensitized nanoparticles, a heterojunction composite material, or combinations thereof. In one embodiment, the nanomatrix layer 165 is between about 1 micron and about 5 microns thick. In another embodiment, the nanomatrix layer 165 is between about 5 microns and about 20 microns thick.

In one embodiment, the photosensitized nanomatrix layer 165 includes photosensitized nanoparticles. Suitable nanoparticle materials include, but are not limited to, oxides, sulfides, selenides, and tellurides of titanium, zirconium, zinc, lanthanum, niobium, strontium and tungsten, or one or more combinations thereof. For example, $TiO_2$, $SrTiO_3$, $CaTiO_3$, $ZrO_2$, $WO_3$, $La_2O_3$, $Nb_2O_5$, sodium titanate, and potassium niobate are suitable nanoparticle materials. The particles can have an average particle size in the range of about 5 nm to about 300 nm. In one embodiment, the photosensitized nanomatrix layer 165 includes nanoparticles with an average size of between about 2 and about 100 nm. In another embodiment, the nanomatrix layer 165 includes nanoparticles with an average size of between about 10 nm and about 40 nm. Preferably, the nanoparticles are titanium dioxide particles having an average particle size of about 20 nm.

In another embodiment, the photosensitized nanomatrix layer 165 includes a heterojunction composite material. An example of a suitable heterojunction composite material is fullerene ($C_{60}$), fullerene particles, carbon nanotubes, or both dispersed in polythiophene or some other hole transport material. In various embodiments of this material, the fullerene particles have an average size of between about 100 nm and about 500 nm. Other examples of suitable heterojunction composite materials are composites comprising conjugated polymers, such as polythiophene and polyquinoline, and composites of conjugated polymers, such as polyphenylene vinylene, in conjunction with non-polymeric materials.

According to the illustrative embodiment, long-range order is not required of the nanomatrix layer 165. For example, the nanomatrix layer 165 does not need to be crystalline nor do the particles or phase regions need to be arranged in a regular, repeating or periodic array.

In various embodiments, the nanomatrix layer 165 further includes a photosensitizing agent. The photosensitizing agent facilitates conversion of incident visible light into electricity to produce the desired photovoltaic effect. It is believed that the photosensitizing agent absorbs incident light resulting in the excitation of electrons in the photosensitizing agent. The excited electrons are then transferred from the excitation levels of the photosensitizing agent into a conduction band of the nanomatrix layer 165. This electron transfer results in an effective separation of charge and the desired photovoltaic effect. Accordingly, the electrons in the conduction band of the nanomatrix layer 165 are made available to drive an external load electrically connected to the photovoltaic cell 110.

In one embodiment, the photosensitizing agent is sorbed (either chemisorbed and/or physisorbed) on the nanomatrix layer 165. The photosentizing agent may be sorbed on a surface of the nanomatrix layer 165, throughout the nanomatrix layer 165, or both. The photosensitizing agent is selected, for example, based on its ability to absorb photons in a wavelength range of operation, its ability to produce free electrons (or electron holes) in a conduction band of the nanomatrix layer 165, and its effectiveness in complexing with or sorbing to the nanomatrix layer 165. Suitable photosensitizing agents may include for example dyes that include functional groups, such as carboxyl and/or hydroxyl groups, that can chelate to the nanoparticles, e.g., to Ti(IV) sites on a $TiO_2$ surface. Examples of suitable dyes include, but are not limited to, porphyrins, phthalocyanines, merocyanines, cyanines, squarates, eosins, and metal-containing dyes such as cis-di(thiocyanato)bis(2,2'-bipyridyl-4,4'-dicarboxylate) ruthenium (II).

The charge carrier media 185 portion of the photovoltaic cells may form a layer in the photovoltaic cell, be interspersed with the material that forms the nanomatrix layer 165, or be a combination of both. The charge carrier media 185 may be any material that facilitates the transfer of electrical charge from a ground potential or a current source to the nanomatrix layer 165 (and/or a photosensitizing agent of the nanomatrix layer 165). A general class of suitable charge carrier media 185 can include, but are not limited to electrolytes, polyelectrolytes, polymeric electrolytes, solid electrolytes, and n-type and p-type conducting polymers.

Other choices for the charge carrier media 185 are possible. In one embodiment, the charge carrier media 185 includes a redox system. Suitable redox systems may include organic and/or inorganic redox systems. Examples of such systems include, but are not limited to, cerium(III) sulfate/cerium(IV), sodium bromide/bromine, lithium iodide/iodine, $Fe^{2+}/Fe^{3+}$, $Co^{2+}/Co^{3+}$ and viologens.

In some illustrative embodiments the charge carrier media 185 includes a polymeric electrolyte. In one version, the polymeric electrolyte includes poly(vinyl imidazolium halide) and lithium iodide. In another version, the polymeric electrolyte includes poly (vinyl pyridinium salts). In still another embodiment, the charge carrier media 185 includes a solid electrolyte. In one version, the solid electrolyte includes lithium iodide and pyridinium iodide. In another version, the solid electrolyte includes substituted imidazolium iodide.

According to some illustrative embodiments, the charge carrier media 185 includes various types of polymeric polyclectrolytes. In one version, the polyelectrolyte includes between about 5% and about 100% (e.g., 5–60%, 5–40%, or 5–20%) by weight of a polymer, e.g., an ion-conducting polymer, about 5% to about 95%, e.g., about 35–95%, 60–95%, or 80–95%, by weight of a plasticizer and about 0.05 M to about 10 M of a redox electrolyte, e.g., about 0.05 M to about 10 M, e.g., 0.05–2 M, 0.05–1 M, or 0.05–0.5 M, of organic or inorganic iodides, and about 0.01 M to about 1 M, e.g., 0.05–5 M, 0.05–2 M, or 0.05–1 M, of iodine. The ion-conducting polymer may include, for example, polyethylene oxide (PEO), polyacrylonitrile (PAN), polymethyl-methacrylate (acrylic) (PMMA), polyethers, and polyphenols. Examples of suitable plasticizers include ethyl carbonate, propylene carbonate, mixtures of carbonates, organic phosphates, and dialkylphthalates.

Referring again to FIGS. 1A, 2B, 2, 3, and 5A–5I, preferably, a photovoltaic cell 110 further includes a catalytic media 170. The catalytic media 170 may include, for example, ruthinium, osmium, cobalt, rhodium, iridium, nickel, palladium or platinum. Suitable metals include, but are not limited to, platinum, ruthenium, rhodium, palladium, iridium, and osmium. Preferably, the catalytic media 170 further includes titanium to facilitate the adhesion of the catalytic media 170 to the electrical connection layer. Preferably, the titanium is deposited in a region or layer about 10 Å thick. In one embodiment, the catalytic media 170 includes a platinum layer between about 13 angstroms (Å) and about 35 Å thick. Preferably, the platinum layer is about 25 angstroms (Å) thick. In another embodiment, the catalytic media 170 includes a platinum layer between about 50 Å and about 800 Å thick. In another embodiment, the catalytic media 170 is between about 15 Å and about 50 Å thick.

Preferably, the photovoltaic modules of the invention further include substrates 100, 102. The substrates 100, 102 of the photovoltaic module preferably include materials that facilitate the fabrication of flexible photovoltaic modules. Further, the substrates 100, 102 may include materials that facilitate the fabrication of photovoltaic modules in a roll-to-roll manufacturing process. A substrate 100, 102 may include, for example, a glass, a composite material, a plastic, a polymeric compound, and combinations thereof. For example, a substrate 100, 102 may include a flexible material such as polyethylene terephthalate (PET), polyacrylonaphthalate, polyimide, polyethylene naphthalate (PEN), polymeric hydrocarbons, cellulosics, or combinations thereof. A substrate 100, 102 may also be chosen from substantially non-flexible materials including, but not limited to, resins, and rigid plastics. A substrate 100, 102 may have one or more substantially planar surfaces or may be substantially non-planar. For example, a non-planar substrate 100, 102 may have a curved or stepped surface.

Preferably, one or more of the substrates 100, 102 are both flexible and significantly light transmitting. Suitable materials for a flexible and significantly light transmitting substrate include, but are not limited to, polyethylene terephthalate (PET), polyacrylonaphthalate, polyimide, polyethylene naphthalate (PEN), polymeric hydrocarbons, cellulosics, or combinations thereof.

In one illustrative embodiment, the invention also provides photovoltaic modules having one or more substrates 100, 102 with glass transition temperatures in the range between about 10° C. and about 300° C. In one embodiment, the invention also provides photovoltaic modules that may include substrates 100, 102 with glass transition temperatures in the range between about 25° C. and about 150° C. For example, one suitable substrate 100, 102 material is PET, which has a glass transition temperature of about 45° C.

It should be recognized that not all materials have a glass transition temperature. For those materials, the important temperature is the temperature at which the material deforms to such an extent that the deformation significantly disrupts the interconnection of the materials forming the nanomatrix layer and/or the electrical connection of the nanomatrix layer with an electrical connection layer.

Figure 2:
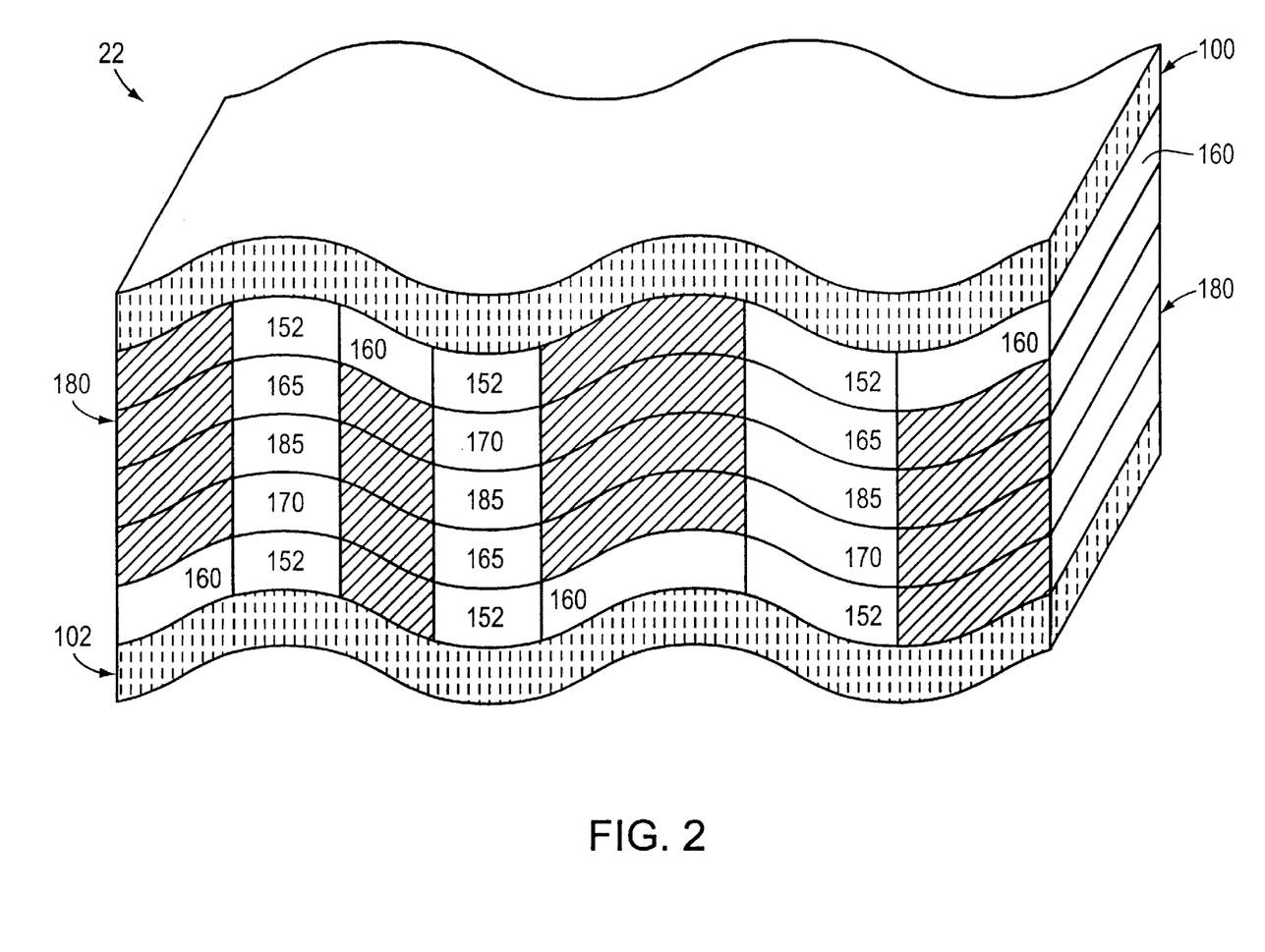
FIG. 2 is a perspective view of a non-planar photovoltaic module according to an illustrative embodiment of the invention.

In some illustrative embodiments, the invention provides non-planar photovoltaic modules. FIG. 2 is a perspective view, partially in cross-section, of a non-planar, serially interconnected photovoltaic module 22 according to an illustrative embodiment of the invention. According to the illustrative embodiment, the non-planar photovoltaic module 22 may be fabricated in both flexible and non-flexible forms. In addition, a non-planar photovoltaic module 22 may be formed, for example, initially from a module with substantially planar substrates, parallel substrates, or both, and then bent, folded or deformed to produce a non-planar photovoltaic module 22. Such deformation may be permanent over a desired range of environmental conditions. Alternatively, the deformation may be non-permanent and maintained, for example, by mechanical restraints that prevent the module 22 from readily reassuming its previous state.

Figure 3:
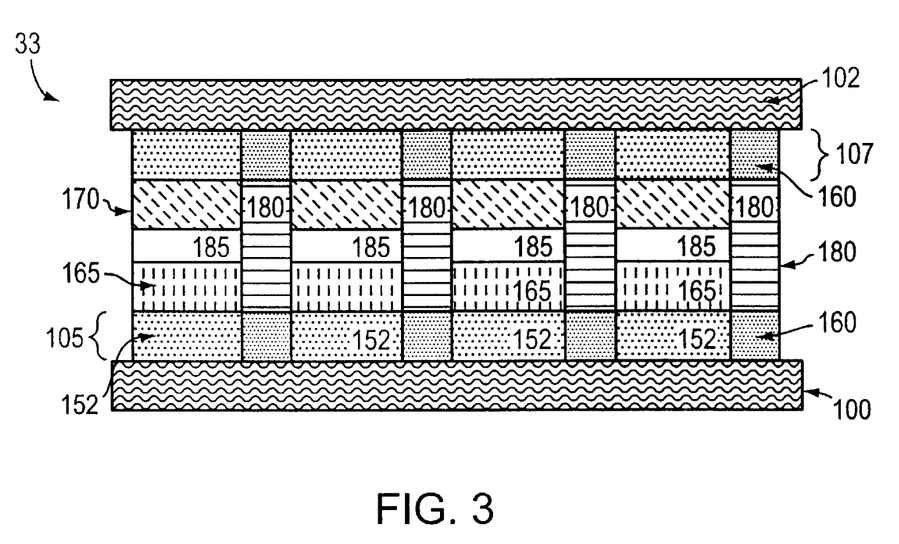
FIG. 3 is a cross-sectional view of a photovoltaic module having parallel connected photovoltaic cells according to an illustrative embodiment of the invention.

FIG. 3 is a cross-sectional view of a parallel interconnected, photovoltaic module 33. In this embodiment, two or more of the photovoltaic cells 110 are connected in parallel. Whether the photovoltaic cells are connected in series, parallel, or a combination of both is a determination that may be made, for example, by the intended use of the photovoltaic module 22, 33. For example, cells may be connected in series to provide higher output current, cells may be connected in parallel to provide higher output voltage, and/or cells may be connected in parallel to decrease the likelihood of complete module failure should one or more photovoltaic cells fail. In addition, according to the illustrative embodiment, the methods of fabrication of the invention are equally applicable to photovoltaic modules including photovoltaic cells connected in series, in parallel, or combinations of both.

In another aspect, the invention provides methods of fabricating a plurality of interconnected photovoltaic cells. In one embodiment, the fabrication method of the invention includes: providing two substrates 100, 102; forming a first group of photovoltaic cells portions 110 on one substrate 100; forming a second group of photovoltaic cell portions 110 on the other substrate 102; and then combining the two substrates 100, 102 and groups of photovoltaic cell portions to produce a photovoltaic module 10. In one embodiment, methods of fabrication are accomplished by a roll-to-roll manufacturing process. Choosing flexible substrates 100, 102 is important to the feasibility of these various manufacturing process embodiments.

FIGS. 4 and 5A–5I illustrate various embodiments of a method of fabricating a plurality of interconnected photovoltaic cells. In one embodiment, the substrate 100 is first provided 420. The substrate 100 may be chosen from a wide assortment of materials and is preferably a significantly light transmitting material. The substrate 100 may include a rigid, semi-rigid or flexible material. Preferably, the substrate 100 includes a flexible polymeric material. The substrate 100 may be, for example, a glass, a semiconductor, a composite material, a plastic, a polymeric material, or other suitable material. Suitable flexible polymeric materials include, but are not limited to, polyethylene terephthalates, polyacrylonaphthalates and polyimides. The substrate 100 may be any suitable thickness but preferably has a thickness in the range from about 2 to about 1,000 microns, such as, for example, about 25 to about 500 microns, or about 150 to about 250 microns.

Figure 4:
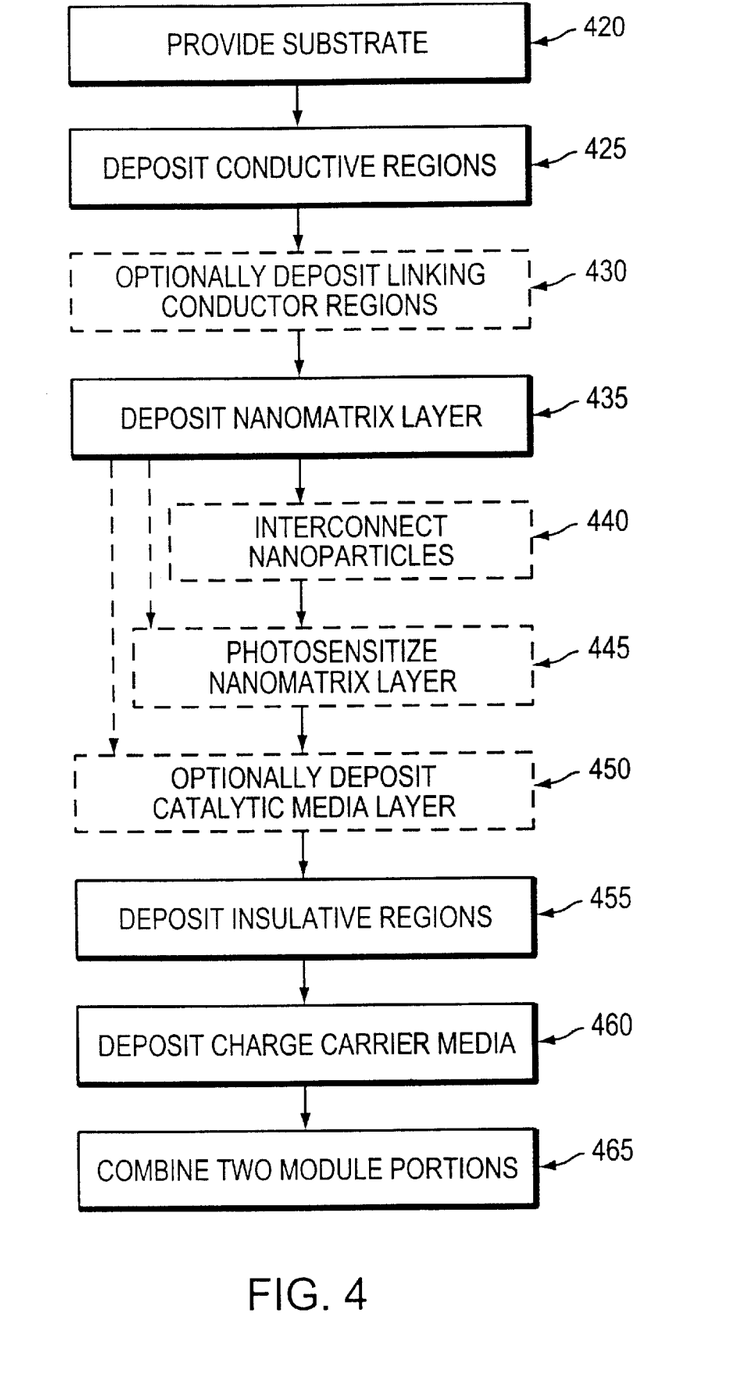
FIG. 4 is a flow diagram depicting various exemplary methods of fabricating photovoltaic modules according to illustrative embodiments of the invention.
Figure 5A:
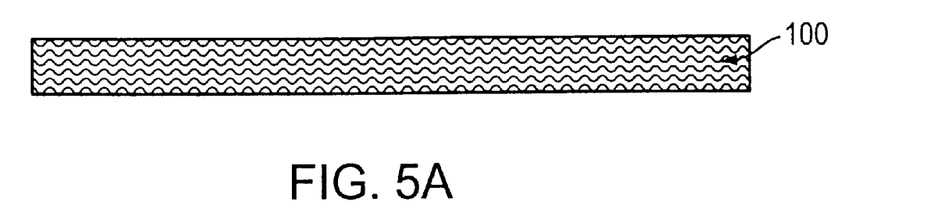
FIGS. 5A–5I depict a series of fabrication states for a photovoltaic module fabricated according to the methods of FIG. 4.
Figure 5B:
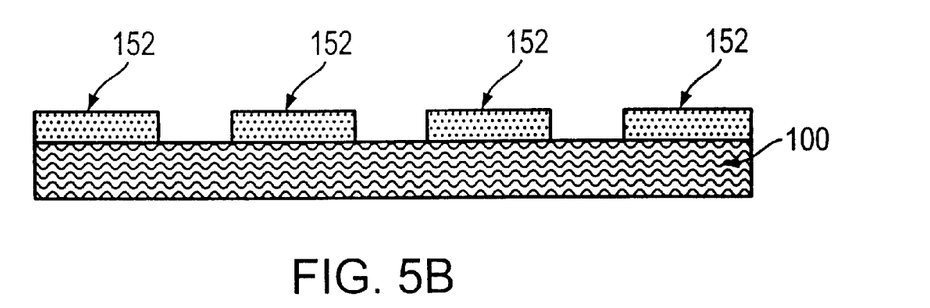

Referring to FIGS. 4 and 5B, a conductive region 152 is deposited 425 on the substrate 100. The conductive regions 152 serve as the basis for the electrodes of the photovoltaic cells in a complete photovoltaic module. The conductive regions 152 may be deposited 425 on a target region of the substrate 100 by thermal evaporation or low temperature sputtering in various embodiments. In addition, the conductive regions 152 may be deposited, for example, by via vacuum deposition. Preferably, the conductive regions 152 include indium tin oxide (ITO). The conductive region 152 may include a transparent conductive material such as, for example, fluorine-doped tin oxide, indium tin oxide (ITO), zinc oxide or tin oxide. In one embodiment, the substrate 100 is prepared with chemical coatings to facilitate the adhesion of the various deposited regions that form the electrical connection layer 105.

In various embodiments, the substrate 100 has a coefficient of thermal expansion that is relatively low and/or comparable to the coefficient of thermal expansion of the one or more regions of the electrical connection layer 105. This thermal property of the substrate 100 operates to help minimize the occurrence of defects, such as cracks, during fabrication. In other embodiments where the substrate 100 is not heated substantially above room temperature, the coefficient of thermal expansion may be higher or significantly different from that of the regions of the electrical connection layer 105. Suitable substrate materials include for example, polyethylene terephthalate (PET), polyethylene naphthalate (PEN), or a polyimide. An example of a polyimide is a KAPTON® polyimide film (available from E. I. du Pont de Nemours and Co.), which has a thermal stability up to about 400° C.

Figure 5C:
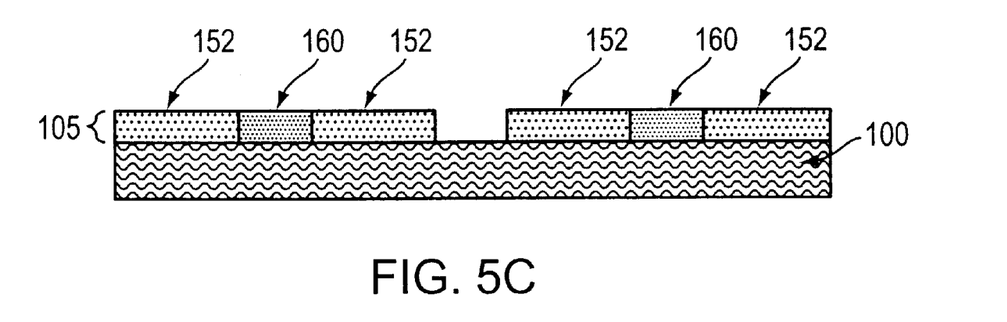

Referring to FIG. 4 and FIG. 5C, the electrical connection layer 105 may further include a linking conductor region 160 deposited 430 between two or more of the conductive regions 152. Preferably, the linking conductor region includes a metal. Suitable metals include, but are not limited to copper, gold, silver, platinum, nickel, palladium, and alloys thereof.

Figure 5D:
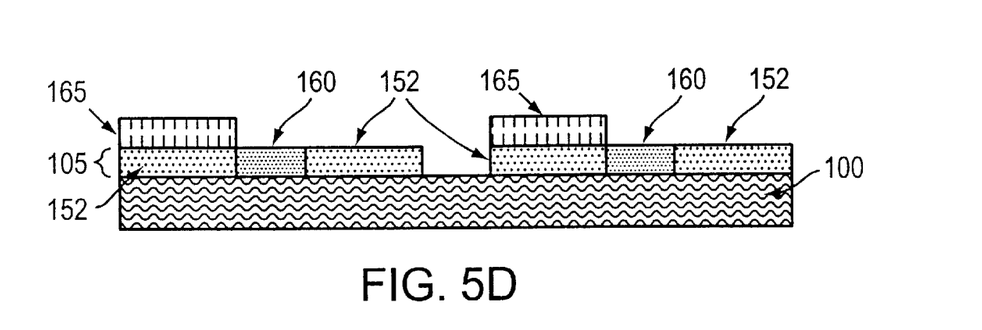
Figure 5E:
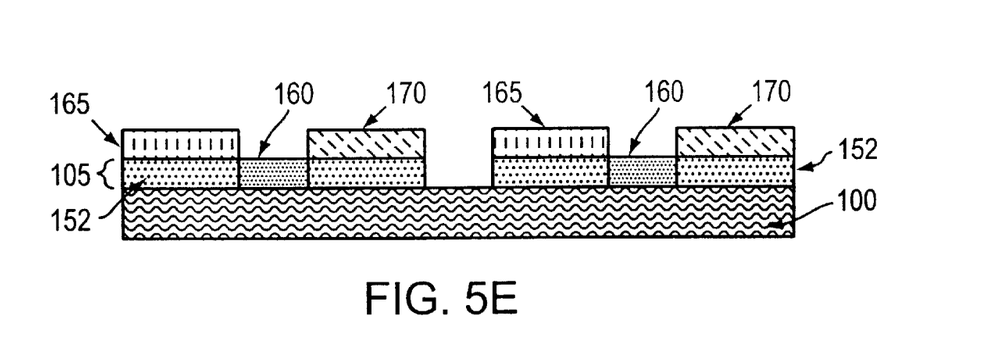

Referring to FIG. 4 and FIG. 5D, in one embodiment, a nanomatrix layer 165 is deposited 435 on a portion of the conductive regions 152 that form part of the electrical connection layer 105. The method of depositing the nanomatrix layer 165 may vary depending on whether the nanomatrix layer 165 includes nanoparticles, heterojunction composite materials, combinations thereof or other suitable materials. The nanomatrix layer 165 can be deposited 435 by a number of techniques, including, for example, spray coating, or knife coating, casting, spin casting, screen printing, stencil printing, colloidal solution deposition, slot coating, curtain coating, gravure coating or inkjet coating.

A photovoltaic module according to the invention may incorporate various nanomatrix layers 165. In those embodiments where the nanomatrix layer 165 includes nanoparticles, a photosensitizing step is performed upon the nanomatrix layer 165. In embodiments where the nanomatrix layer 165 includes heterojunction composite the dye sensitization step 445 is not required and the interconnecting step 440 may not be required. Embodiments that do not require photosensitization of a nanomatrix layer 165 may be fabricated by skipping, for example, the interconnection step 440 and photosensitizing step 445 as appropriate to the given embodiment being fabricated.

In some embodiments, the nanomatrix layer 165 includes heterojunction composite materials that are deposited 435 upon one or more of the conductive regions 152. Suitable heterojunction composite materials include, for example, fullerene ($C_{60}$), fullerene particles, or both dispersed in polythiophene, polyphenyline, vinylene and combinations thereof. In other embodiments, the interconnection of the heterojunction composite materials can be facilitated by dispersing the heterojunction composite materials in a conducting polymer. Heterojunction composite materials can be deposited on portions of the conductive regions 152 by the previously described general nanomatrix deposition techniques and specifically by screen printing or gravure coating. The interconnection of the heterojunction composite materials may be an intrinsic property of such materials and as such not require a specific interconnection step. Similarly, the photosensitization may be an intrinsic property of such materials and as such not require a specific photosensitizing step.

In various illustrative embodiments, the constituent elements of the nanomatrix layers 165 may be interconnected before, during, and after the deposition of the nanomatrix layer 165. For example, in embodiments where the nanomatrix layer 165 includes nanoparticles, the deposition 435 and interconnection 440 of the nanoparticles forming the nanomatrix layer 165 may occur simultaneously. In other embodiments employing a nanomatrix layer including nanoparticles, the interconnection and deposition may occur by pouring a colloidal solution of nanoparticles dispersed in a suitable solvent onto portions of the conductive regions and letting the solvent evaporate. In various fabrication method embodiments using a colloidal solution of dispersed nanoparticles, the colloidal solution may further include cross-linking agents to facilitate the interconnections of the nanoparticles forming part of the nanomatrix layer 165.

In other embodiments, interconnection of the nanomatrix layer 165 is achieved through an interconnecting step with or without heating, and with or without a cross-linking agent, following nanoparticle deposition. In one embodiment, the interconnection of a nanoparticle based nanomatrix layer is preferably conducted at temperatures below about 150° C. or more preferably below about 70° C. In another embodiment, the interconnection of a nanoparticle based nanomatrix layer is preferably conducted such that the temperature of the substrate 100 remains below about 150° C., or more preferably below about 70° C., during the interconnecting step. As a result, the invention provides methods for forming photovoltaic cells on a wide variety of heat sensitive substrates and a wide variety of flexible, significantly light transmitting substrates.

In some of the various colloidal solutions of dispersed nanoparticles, as well as in other embodiments, the nanomatrix layer 165 includes nanoparticles with an average size in the range from about 2 nm to about 100 nm. In another embodiment, the nanomatrix layer 165 includes nanoparticles with an average size in the range from about 10 nm to about 40 nm. Preferably, the nanoparticles include titanium dioxide particles having an average particle size of about 20 nm. The nanoparticles used in various nanomatrix layer 165 embodiments include, but are not limited to, zirconium oxides, zinc oxides, tungsten oxides, sulfides, selenides, tellurides, and one or more combinations thereof.

In one embodiment, a colloidal solution for use in depositing 435 the nanomatrix layer 165 is prepared by dispersing the nanoparticles in a suitable solvent, such as water, alcohols, ketones, or other organic solvents. For example, in one illustrative embodiment, the solution is prepared by incrementally adding about 20 mL of dilute nitric acid or acetic acid (pH about 3–4 in de-ionized water) to about 12 grams of $TiO_2$ in a mortar and pestle while grinding. The acid is added in 1 mL increments after the preceding mixing and grinding has produced a uniform paste free of lumps. In an alternative illustrative embodiment, about 0.2 mL of acetylacetone is added to about 1 mL of water and added to 12 grams of $TiO_2$ powder, followed by adding about 19 mL of water in 1 mL increments, while grinding. Nanoparticle colloids, including, for example, nanoparticles with an average size in the range of about 20 nm to about 100 nm, may also be prepared from appropriate precursors using standard sol-gel techniques.

In one embodiment, the nanoparticle based nanomatrix layer 165 is deposited 435 as a colloidal solution to form a transparent nanocrystalline layer. The nanoparticles, in part, provide a high surface area, thereby increasing the amount of photosensitizing agent which can sorb to the particles which in turn increases the use of absorbed light. In one embodiment, nanoparticle deposition 435 generally includes forming a colloidal semiconductor solution, masking previous deposited layers to expose a target area, and then applying the solution to that targeted nanoparticle receiving area.

Referring again to FIG. 4, in one embodiment, subsequent to nanomatrix layer 165 deposition 435 the nanomatrix layer 165 is interconnected in an interconnection step 440. The interconnection step 440 may be used in those embodiments which have a nanomatrix layer 165 including nanoparticles or other suitable interconnectable compounds. Various plastics, resins, polyesters, and various other suitable materials may be used as substrates as a result of the low temperatures at which interconnection of the nanomatrix layer 165 can be performed. In one embodiment, a substrate 100 and an incomplete electrical connection layer 105 including some conductive regions 152, with the colloidal solution deposited thereon, are heated between about room temperature and about 70° C. for less than about 10 minutes to yield a thin film of the nanoparticles adhered to parts of the electrical connection layer 105. Preferably, the nanoparticles are contacted with a cross-linking agent during the interconnecting process. The thin film may then be partially dried. In one illustrative embodiment, the interconnecting of the nanoparticle layer is achieved by heating the substrate to a temperature no greater than about 200° C. The degree of deformation upon heating of the various component layers, regions of the electrical connection layer, 105 and the substrate 100, impact the range of possible interconnecting temperatures at this step of fabrication. According to the illustrative embodiment, the various layers may be interconnected at temperatures below, at, or slightly above (depending on the time the substrate is subjected to the temperature) the glass transition temperature of the substrate 100.

The cross-linking agent utilized, may be, for example, a metal alkoxide, metal halide or metal acetate. The cross-linking agent and the nanoparticles particles may include an identical chemical element, (e.g., a metal such as titanium, zirconium, or zinc). The cross-linking agent and the nanoparticles may also include an identical chemical bond, (e.g., a metal to nonmetal bond such as a metal-oxygen bond). The cross-linking agent may also include a sol-gel precursor.

In an exemplary cross-linking step, a cross-linking agent solution is prepared by mixing a sol-gel precursor agent, e.g., a titanium tetra-alkoxide such as titanium tetra-butoxide, with a solvent, such as ethanol, propanol, butanol, or higher primary, secondary, or tertiary alcohols, in a weight ratio of 0–100%, e.g., about 5 to about 25%, or about 20%. According to the illustrative embodiment, the solvent can include any material that is stable with respect to the precursor agent (e.g., does not react with the agent to form metal oxides such as $TiO_2$). Preferably, the solvent is substantially free of water, which can cause precipitation of $TiO_2$.

In one embodiment, the cross-linking agent is applied by soaking the particles in the cross-linking agent solution. Other methods of applying the cross-linking agent include, for example, spraying the agent, as an aerosol, in neat form or in a suitable solvent, moving the nanoparticles layer through a solution of the cross-linking agent.

Preferably, the substrate 100 and the electrical connection layer's 105 conductive regions 152 with a cross-linked nanoparticle layer formed thereon are heated. Heating facilitates the drying of the layers by evaporating solvent, if any, from the cross-linking solution. Depending on the heating temperature, heating may also facilitate interconnecting the nanoparticles 440 and/or to connect the nanoparticles with the conductive region 152. Generally, the heating temperature selected is dependent on the cross-linking agent used and the materials forming the substrate 100.

The heating temperature and heating time are selected such that the cross-linking agent is not heated to a temperature significantly higher than its decomposition temperature, and such that the substrate 100 is not heated to a temperature such that the substrate 100 significantly deforms (e.g., the glass transition temperature, melting temperature, decomposition temperature, etc.). For example, for a $TiO_2$ nanoparticle layer cross-linked with titanium alkoxide, the heating temperature may be up to about 150° C. for a polymeric substrate such as PET, up to about 400° C. for a KAPTON® substrate, and up to 500° C. for a glass substrate, although lower temperatures can be used. In various embodiments, heating time ranges from about 30 seconds to less than 2 minutes.

Referring to FIGS. 4 and 5D, in one embodiment, after deposition the nanomatrix layer 165 is photosensitized 445. Photosensitization may be accomplished, for example, by introducing a dye into the deposited interconnected nanoparticle layer. In one embodiment, the nanomatrix layer 165 is photosensitized by dispensing a dye onto the nanomatrix layer 165. In embodiments using heterojunction composite to form the nanomatrix layer 165, the photosensitization step may not be required. In other embodiments, a photosensitizing agent can be used to photosensitive the nanomatrix layer 165 including interconnected nanoparticles.

In various embodiments, the nanomatrix layer 165 includes a photosensitizing agent. In one embodiment, the nanomatrix layer 165 is sensitized with a photosensitizing agent after the nanomatrix layer 165 has been deposited upon an electrical connection layer 105, 107 and/or substrate 100. In another embodiment, the photosensitizing agent is incorporated into the nanomatrix layer 165 prior to its deposition. The photosensitizing agent may include for example, a metal ion selected from a group of divalent and trivalent metals. In various embodiments, the photosensitizing agent includes at least one of a ruthenium transition metal complex, an osmium transition metal complex, and an iron transition metal complex. In further embodiments, the photosensitizing agent includes an organic molecule such as a xanthine, merocyanine, cyanine, phtalocyanine or pyrrole-type dye.

In one embodiment, the photosensitizing agent is a dye. Illustratively, the dye is applied to the nanomatrix layer 165 by soaking the nanomatrix layer 165 in the dye solution for about 5 minutes up to a few hours. Other methods of applying the dye solution include, for example, spray coating. After application of the dye, excess dye is removed by washing with a solvent, such as ethanol.

In one illustrative embodiment, after deposition of the nanomatrix layer 165 a catalytic media layer 170 is deposited 450. In one embodiment, the catalytic media layer 170 is deposited 450 on the conductive regions 152 of the electrical connection layer 105 that were not coated with the nanomatrix layer 165 in the fabrication step 435 and FIG. 5E. This catalytic media layer 170 is preferable, but optional, and may be chosen to facilitate the transfer of electrons ejected by the photoexcited molecules within the photovoltaic cells.

Catalytic media layers 170 that have electron reducing properties, facilitate reducing the charge carrier media 185 which then in turn reduces oxidized photoexcited molecules. Preferably, the catalytic media layer 170 includes platinum. The catalytic media layer 170 may also include carbon, such as for example fullerene. In one embodiment, a thin platinum catalyst layer is electrodeposited on the conductive region of the substrate 100 by using a solution with about 0.05 g/L $PtCl_4$ and 0.025 M HCl, a current density of about 1 $mA/cm^2$ for about 2–5 minutes. In one embodiment, the resultant catalytic media layer 170 is between about 2 nm and about 10 nm thick. Preferably, the catalytic media 170 further includes titanium to facilitate the adhesion of the catalytic media 170 to the electrical connection layer. Preferably the titanium is deposited in a region or layer about 10 Å thick. Other suitable metals may be used to facilitate the adhesion of the catalytic media 170 to the electrical connection layer in various embodiments.

Figure 5F:
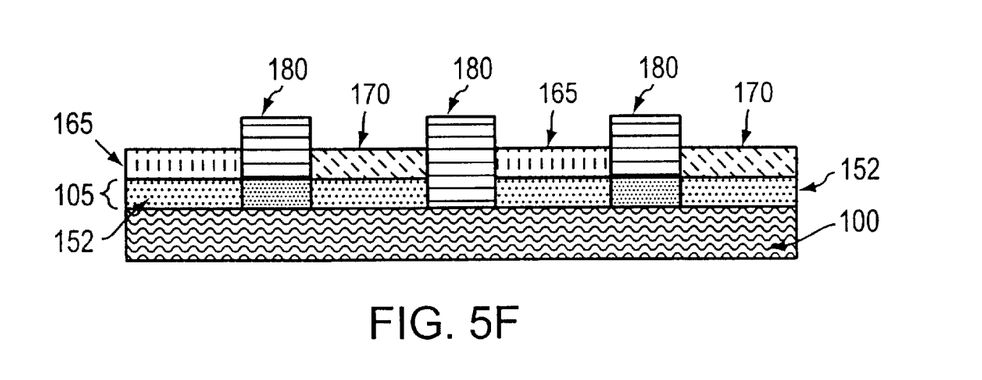

Referring to FIG. 4 and FIG. 5F, in one embodiment, an insulative material is then deposited 455 on the substrate 100 in between the conductive regions 152 to form insulative regions 180 in the electrical connection layer 105. Suitable insulative materials include, but are not limited to, epoxies, and acrylates. Preferably, the insulative material has adhesive properties to facilitate combining two substrates, or substrate portions, together to form a photovoltaic module 10 according to the invention.

Figure 5G:
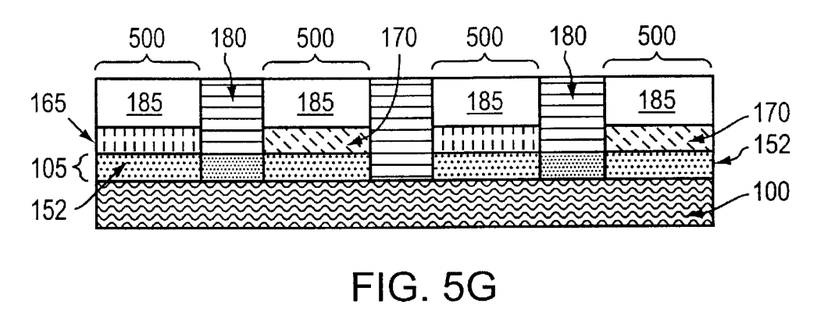

Referring to FIG. 4 and FIG. 5G, in various embodiments, a charge carrier media 185 is then deposited 460. In one embodiment, the charge carrier media 185 is deposited so as to not extend substantially beyond previously deposited insulative regions 180. In one embodiment, the charge carrier media 185 includes a redox mediator to facilitate the flow of electrons in the photovoltaic cells 110. This facilitates cycles of excitation, oxidation, and reduction that cause individual cells of the photovoltaic module 10 to produce a flow of electrons. The flow of electrons provides electrical energy for any external load connected to the photovoltaic module. Suitable charge carrier media 185 include but are not limited to, electrolytes, polymeric electrolytes, redox systems, n-type and p-type conducting polymer, or other suitable electrical charge liberating compounds. For example, one suitable redox system is the $I^-/I^-_3$ system. The charge carrier media 185 may also be selected from a class of polyelectrolytes.

The charge carrier media 185 is preferably a polymeric, relatively viscous, e.g., jelly-like, material. As a result, the charge carrier media 185 can be applied using techniques that may not be practical or feasible if, for example, the charge carrier media 185 were a liquid. These techniques include, for example, spray coating, roller coating, and knife or blade coating. In one illustrative embodiment, the charge carrier media 185 is prepared by forming a solution having an ion-conducting polymer, a plasticizer, and a mixture of iodides and iodine. The polymer provides mechanical and/or dimensional stability; the plasticizer helps the gel/liquid phase transaction temperature, and the iodides and iodine act as redox electrolytes.

In one illustrative embodiment, the charge carrier media 185 includes about 10% of polyethylene oxide, about 90% of 1:1 by weight mixture of ethyl carbonate: propylene carbonate, about 0.05 M iodine, and about 0.5 M lithium tetramethylammonium iodide. This polymeric electrolyte typically has a relatively long shelf life (e.g., up to a few years), experiences minimal phase segregation during processing or while the photovoltaic module is in use, and may be used without processing, such as melting, prior to deposition.

Figure 5H:
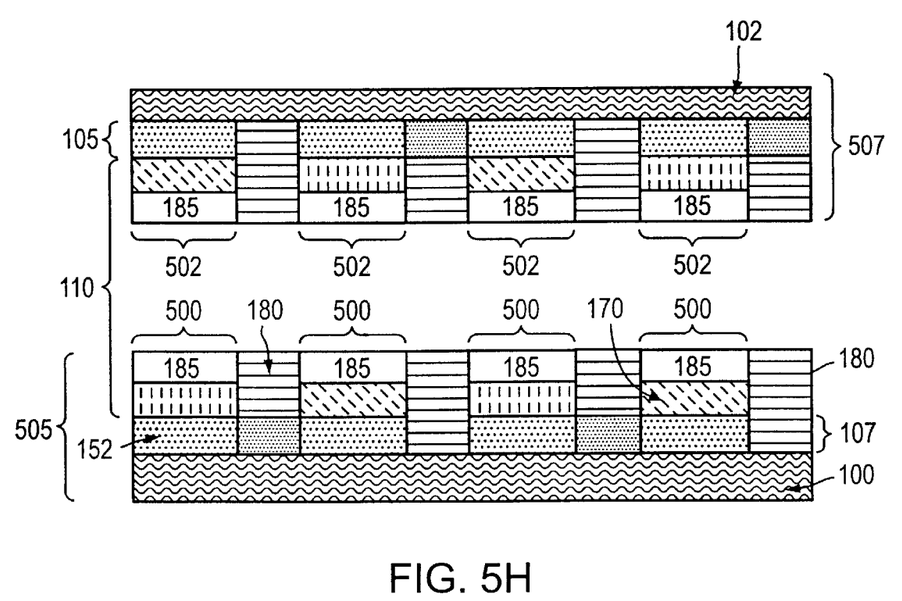

FIG. 5G illustrates one embodiment of a group of photovoltaic cell portions 500 on a substrate 100 formed according the fabrication steps of FIG. 4. Referring to FIG. 5H, in one embodiment, a second group of photovoltaic cell portions 502 is formed on a second substrate 102 by repeating as necessary the various fabrication steps of FIG. 4. The first photovoltaic cell portions 500 and the second photovoltaic cell portions 502 are then combined to form a photovoltaic module 55. For example, the first photovoltaic cell portions 500 and the second photovoltaic cell portions 502 may be combined to form a plurality of photovoltaic cells interconnected in series. The orientation of the first and second photovoltaic module portions 500, 502 illustrates one manner in which the portions 500, 502 may be combined.

Figure 5I:
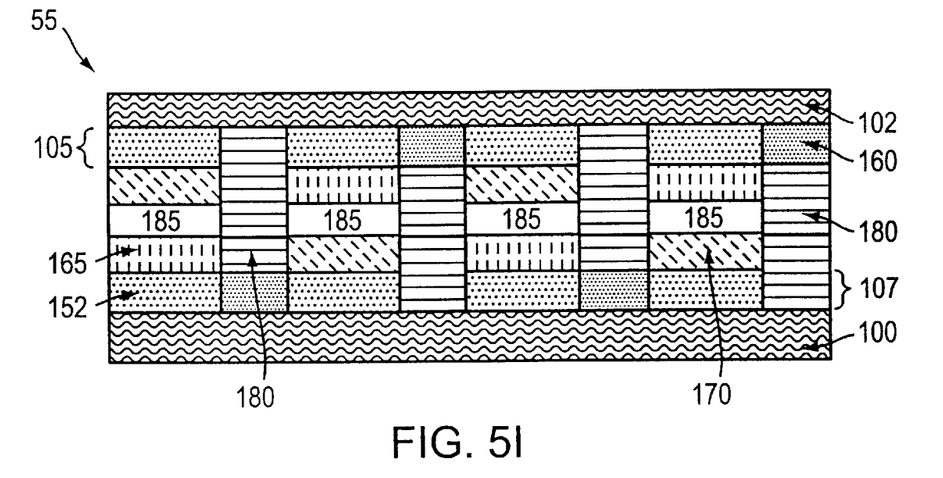

FIG. 5H illustrates a first photovoltaic module portion 505 and a second photovoltaic module portion 507, each module portion includes the various component layers of a photovoltaic module. As illustrated, a plurality of photovoltaic cells 110 are disposed between two electrical connection layers 105, 107. The photovoltaic cell portions 500, 502 are aligned to facilitate the combining of the first photovoltaic module portion 505 and the second photovoltaic module portion 507 to produce a serially connected photovoltaic module. FIG. 5I shows the resulting serially interconnected photovoltaic module 55 after combining the two photovoltaic module portions 505, 507.

Although FIGS. 5H and 5I show a serially interconnected photovoltaic module 55, various photovoltaic module portions can be combined to produce photovoltaic modules with a plurality of photovoltaic cells connected in parallel or combination photovoltaic modules with both parallel and serial interconnections among the photovoltaic cells. In another embodiment, the first group of photovoltaic module portions 505 are formed on a first region of a substrate 100, while forming a second group of photovoltaic module portions 507 on a second region of the same substrate 100. The substrate 100 may then be physically divided, or in some embodiments folded, to combine the respective photovoltaic module portions to produce a final photovoltaic module. The interconnections between the photovoltaic cells of the final module can be parallel, serial or a combination thereof.

In various embodiments, the completed photovoltaic module 10, 22, 33, and 55 is sealed at its perimeter with an epoxy or Surlyn® (available from DuPont) to prevent permeation of water and/or air between the sheets of the module or into individual photovoltaic modules. In one embodiment, the photovoltaic module is alternatively or additionally thermally sealed. According to one feature, the photovoltaic module is then laminated with a moisture barrier, such as a polymeric overlayer, e.g., Surlyn® (available from DuPont).

EXAMPLES

The following examples are illustrative and not intended to be limiting.

Example 1

A dye-sensitized solar cell having a flexible substrate was made according to the following procedures.

A PET substrate about 200 microns thick, and about 10 mm×10 mm square was coated with an about 200 nm thick ITO coating by thermal evaporation. Colloidal $TiO_2$ solution was prepared by dispersing P25 (a commercially available titania comprising approximately 80% anatase and 20% rutile crystaline $TiO_2$) particles in water (pH 3–4). The $TiO_2$ was deposited on the PET substrate, by spin coating to form a nanoparticle layer on the slide. For preparation of nanoparticle dispersions, techniques such as microfluidizing, attritting, or ball milling may be used. After deposition, the coating was heated at about 50° C. for about 1 minute or less.

The $TiO_2$-coated PET substrate was then coated with a cross-linking agent solution comprising a 0.3 mM solution of titanium tetrabutoxide in ethanol to interconnect the nanoparticles. The coated substrate was dried at about 120° C. for about 30–40 seconds.

The interconnected nanoparticle layer was dye-sensitized by coating with a solution of cis-di(thiocyanato)bis(2,2'-bipyridyl-4,4'-dicarboxylate) ruthenium (II) in ethanol (1 mg/mL).

A redox polyelectrolyte (10% polyethylene oxide, 90% 1:1 ethyl carbonate:propylene carbonate, 0.05 M iodine and 0.5 M LiI) was coated on the dye-sensitized, interconnected substrate, and sandwiched with a second PET substrate coated with an ITO conductive layer about 200 nm thick and a platinum catalyst layer about 2.5 nm thick. The individual cells exhibited a solar conversion efficiency of about 5%.

Example 2

A dye-sensitized solar cell having rigid substrates was made according to the following procedures.

An ITO-coat glass slide (surface resistance 8 Ω/cm$^2$) was coated with a TiO$_2$ (P25) nanoparticle film about 10 microns thick by spin coating from a TiO$_2$ dispersion. The coated slide was dried at room temperature for about 30 minutes and interconnected by sintering at about 450° C. in an oven for 1 hour.

The sintered slide was dye-sensitized by soaking the slide overnight in a solution of cis-di(thiocyanato)bis(2,2'-bipyridyl-4,4'-dicarboxylate) ruthenium (II) in ethanol (1 mg/mL).

A redox polyelectrolyte (10% polyethylene oxide, 90% 1:1 ethyl carbonate:propylene carbonate, 0.05 M iodine and 0.5 M LiI) was coated on the substrate, and sandwiched with a second glass slide coated with an ITO conductive layer about 200 nm thick and a platinum catalyst layer about 2.5 nm thick.

The cell exhibited a solar conversion efficiency of about 7.3%. The polyelectrolyte was stable up to at least 180 days with no observable evidence of phase segregation.

What is claimed is:

1. A photovoltaic module comprising:
   first and second photovoltaic cells each including a photosensitized nanomatrix layer and a charge carrier media, and each being sandwiched between,
   a first flexible significantly light transmitting substrate having at least one insulator disposed thereon, the insulator electrically insulating at least a portion of the first photovoltaic cell from at least a portion of the second photovoltaic cell, and
   a second flexible significantly light transmitting substrate having a first and a second conductive element disposed thereon, the first conductive element being associated with and for directing module current through the first photovoltaic cell in a first direction and the second conductive element being associated with and for directing the module current through the second photovoltaic cell in a second direction substantially opposite to the first direction.

2. The photovoltaic module of claim 1, wherein the first conductive element includes ITO.

3. The photovoltaic module of claim 1, wherein the insulator includes an adhesive material.

4. The photovoltaic module of claim 1, wherein the insulator includes a material other than the material forming the first and second substrates.

5. The photovoltaic module of claim 1, wherein the first conductive element comprises a significantly light transmitting material.

6. The photovoltaic module of claim 1, wherein the first and second photovoltaic cells further include a catalytic media.

7. The photovoltaic module of claim 6, wherein the catalytic media comprises platinum.

8. The photovoltaic module of claim 7, wherein the catalytic media further comprises ITO.

9. The photovoltaic module of claim 1, wherein the photosensitized nanomatrix layer comprises particles with an average size substantially in the range of 5 nm to 300 nm.

10. The photovoltaic module of claim 1, wherein the photosensitized nanomatrix layer comprises particles with an average size substantially in the range of 10 nm to 40 nm.

11. The photovoltaic module of claim 1, wherein the photosensitized nanomatrix layer comprises interconnected titanium dioxide nanoparticles.

12. The photovoltaic module of claim 1, wherein the photosensitized nanomatrix layer comprises particles of materials selected from the group consisting of zirconium oxides, zinc oxides, tungsten oxides, sulfides, selenides, tellurides, and one or more combinations thereof.

13. The photovoltaic module of claim 1, wherein the photosensitized nanomatrix layer comprises a photosensitizing agent.

14. The photovoltaic module of claim 1, wherein the photosensitized nanomatrix layer comprises interconnected nanoparticles.

15. The photovoltaic module of claim 1, wherein the photosensitized nanomatrix layer comprises a heterojunction composite material.

16. The photovoltaic module of claim 13, wherein the photosensitizing agent comprises an organic molecule selected from the group consisting of xanthines, cyanines, merocyanines, phthalocyanines, and pyrroles.

17. The photovoltaic module of claim 13, wherein the photosensitizing agent comprises a metal ion selected from the group consisting of divalent and trivalent metals.

18. The photovoltaic module of claim 13, wherein the photosensitizing agent comprises at least one of a ruthenium transition metal complex, an osmium transition metal complex, and an iron transition metal complex.

19. The photovoltaic module of claim 13, wherein the charge carrier media comprises an electrolyte redox system.

20. The photovoltaic module of claim 13, wherein the charge carrier media comprises a polymeric electrolyte.

21. The photovoltaic module of claim 1, wherein at least one of the first and second substrates includes at least one of polyethylene terephthalate and polyethylene naphthalate.

22. The photovoltaic module of claim 1, wherein the first and second substrates have a glass transition temperature of less than about 300° C.

23. The photovoltaic module of claim 1, wherein the first and second substrates have a glass transition temperature in the range from about 400° C. to about 150° C.

24. The photovoltaic module of claim 1, wherein at least one of the first and second conductive elements transmit at least about 60% of incident visible light.

25. The photovoltaic module of claim 1, wherein the charge carrier media transmits at least about 60% of incident visible light.

26. A photovoltaic module comprising:
   first and second photovoltaic cells each including a photosensitized nanomatrix layer and a charge carrier media, and each being sandwiched between,
   a first flexible significantly light transmitting substrate having at least one insulator disposed thereon for electrically insulating at least a portion of the first cell from at least a portion of the second cell; and
   a second flexible significantly light transmitting substrate having a first conductor associated with the first photovoltaic cell, a second conductor associated with the second photovoltaic cell and a linking conductor disposed between the first and second conductors for providing an electrical connection between the first and second photovoltaic cells.

27. The photovoltaic module of claim 26, wherein at least one of the first and second substrates includes at least one of polyethylene terephthalate and polyethylene naphthalate.

28. The photovoltaic module of claim 26, wherein the charge carrier media comprises an electrolyte redox system.

29. The photovoltaic module of claim 26, wherein the photosensitized nanomatrix layer comprises interconnected nanoparticles.

30. A photovoltaic module comprising:
   a first significantly light transmitting flexible substrate;

a second significantly light transmitting flexible substrate;
a first module section sandwiched between the first and second substrates, the first module section including,
   a first electrical conductor contacting the first substrate,
   a first photosensitized nanomatrix layer contacting the first electrical conductor,
   a first charge carrier media contacting the first photosensitized nanomatrix layer, and
   a second electrical conductor contacting the first charge carrier media and the second substrate,
a second module section sandwiched between the first and second substrates,
the second photovoltaic module section including,
   a third electrical conductor contacting the second substrate,
   a second photosensitized nanomatrix layer contacting the third electrical conductor,
   a second charge carrier media contacting the second photosensitized nanomatrix layer, and
   a fourth electrical conductor contacting the second charge carrier media and the first substrate; and
a third module section including a linking conductor electrically interconnecting the first and second module sections.

31. The photovoltaic module of claim 30, wherein the charge carrier media comprises an electrolyte redox system.

32. The photovoltaic module of claim 30, further comprising an electrical insulator for insulating at least a portion of the first module section from the second module section.

33. The photovoltaic module of claim 30, wherein the photosensitized nanomatrix layer comprises interconnected nanoparticles.

* * * * *